United States Patent [19]

Marinelli

[11] 4,159,694
[45] Jul. 3, 1979

[54] APPARATUS FOR DEPOSITING EPITAXIAL SEMICONDUCTOR FROM THE LIQUID PHASE

[75] Inventor: Donald P. Marinelli, Hamilton Square, N.J.

[73] Assignee: RCA Corporation, New York, N.Y.

[21] Appl. No.: 926,084

[22] Filed: Jul. 19, 1978

Related U.S. Application Data

[62] Division of Ser. No. 879,488, Feb. 21, 1978, Pat. No. 4,123,302.

[51] Int. Cl.² .................... B05C 3/00; B05C 3/02
[52] U.S. Cl. .................... 118/401; 118/412; 148/171; 148/172
[58] Field of Search ............... 118/412, 415, 401, 422; 156/622; 148/171, 172; 427/431

[56] References Cited

U.S. PATENT DOCUMENTS

| 3,664,294 | 5/1972 | Solomon | 118/412 X |
| 3,692,592 | 9/1972 | Marinelli | 148/172 |
| 3,747,562 | 7/1973 | Stone et al. | 118/415 |
| 3,753,801 | 8/1973 | Lockwood et al. | 148/171 |
| 3,755,011 | 8/1973 | Kleinknecht et al. | 148/171 |
| 3,765,959 | 10/1973 | Unno et al. | 148/171 |
| 3,933,538 | 1/1976 | Akai et al. | 148/171 |
| 3,997,377 | 12/1976 | Izawa et al. | 148/172 |
| 4,032,370 | 6/1977 | Matare | 148/171 |
| 4,033,291 | 7/1977 | Naito et al. | 118/412 |
| 4,063,972 | 12/1977 | Akai et al. | 148/171 |

Primary Examiner—Edward C. Kimlin
Attorney, Agent, or Firm—H. Christoffersen; D. S. Cohen

[57] ABSTRACT

A furnace boat has a plurality of wells therein. A first slide movably extends through the boat along and across the bottom of the wells. The first slide carries a substrate on which layers of semiconductor material are to be deposited. A second slide movable extends through the boat and across the wells adjacent the open tops of the wells. The second slide supports the starter deposition materials. A wafer extends partially across each well adjacent each slide, and an inclined guide plate extends partially across each well from adjacent the second slide to an edge of the wafer. Molten deposition material is deposited from the second slide onto the inclined guide plate and rolls into an end of the space between the wafer and the substrate carried on the first slide. The deposition material is then sucked into the space between the wafer and substrate by capillary action. Upon cooling the furnace boat, the semiconductor material will deposit from the deposition material onto the substrate. The first slide can be moved to carry the substrate into each well where a separate epitaxial layer can be deposited on the substrate.

6 Claims, 2 Drawing Figures

APPARATUS FOR DEPOSITING EPITAXIAL SEMICONDUCTOR FROM THE LIQUID PHASE

This is a division, of application Ser. No. 879,488, filed Feb. 21, 1978, now U.S. Pat. No. 4,123,302.

The present invention relates to a method and apparatus for depositing epitaxial layers of a semiconductor material on a substrate by a liquid phase deposition technique, and particularly to such a method and apparatus for depositing thin layers of the semiconductor material.

A technique which has come into use for making certain types of semiconductor devices, particularly semiconductor devices made of the group III-V semiconductor materials and their alloys, such as light emitting devices and transferred electron devices, is known as "liquid phase epitaxy." Liquid phase epitaxy is a method for depositing an epitaxial layer of a single crystalline semiconductor material on a substrate wherein a surface of the substrate is brought into contact with a solution of a semiconductive material dissolved in a molten metal solvent, the solution is cooled so that a portion of the semiconductor material in the solution precipitates and deposits on the substrate as an epitaxial layer, and the remainder of the solution is removed from the substrate. The solution may also contain a conductivity modifier which deposits with the semiconductor material to provide an epitaxial layer of a desired conductivity type. Two or more epitaxial layers can be deposited one on top of the other to form a semiconductor device of a desired construction including a semiconductor device having a PN junction between adjacent epitaxial layers of opposite conductivity type.

U.S. Pat. No. 3,565,702 to H. Nelson, issued Feb. 23, 1971, entitled "DEPOSITING SUCCESSIVE EPITAXIAL SEMICONDUCTIVE LAYERS FROM THE LIQUID PHASE," describes a method and apparatus for depositing one or more epitaxial layers by liquid phase epitaxy and is particularly useful for depositing a plurality of epitaxial layers in succession. The apparatus includes a furnace boat of a refractory material having a plurality of spaced wells in its top surface and a slide of refractory material movable in a passage which extends across the bottom of the wells. In the use of this apparatus, a solution is provided in a well and a substrate is placed in a recess in the slide. The slide is then moved to bring the substrate into the bottom of the well so that the surface of the substrate is brought into contact with the solution. When the epitaxial layer is deposited on the substrate, the slide is moved to carry the substrate out of the well. To deposit a plurality of epitaxial layers on the substrate, separate solutions are provided in separate wells and the substrate is carried by the slide to each of the wells in succession to deposit the epitaxial layers on the substrate.

Heretofore, in depositing an epitaxial layer by the liquid phase epitaxy technique, a large volume of the solution was used to assure good coverage of the entire surface on which the epitaxial layer was deposited. The use of a large volume of the solution creates certain undesirable effects. When the large volume of the solution is cooled, precipitation of the semiconductor material in the solution takes place throughout the solution. The semiconductor material which precipitates adjacent the surface of the substrate deposits thereon to form the epitaxial layer. However, the semiconductor material which precipitates in the portion of the solution spaced from the surface of the substrate forms platelets of the semiconductor material. These platelets can create local instabilities in the surface morphology of the substrate, yielding an uneven surface of the epitaxial layer. Also, in the deposition of an epitaxial layer by the liquid phase epitaxy techniques, the volume of the solution determines the thickness of the epitaxial layer which is deposited per degree reduction of the temperature of the solution. The greater the volume of the solution, the thicker the epitaxial layer deposited per degree reduction of the temperature. Thus, with the use of a large volume of the solution, it is difficult to control the decrease of the temperature of the solution precisely enough to deposit very thin epitaxial layers.

In order to prevent the formation of platelets so as to achieve epitaxial layers having smooth surfaces and to permit the deposition of thin epitaxial layers, it would be desirable to use small volumes of the solutions. However, it has been found that to merely reduce the volume of the solution sufficiently to overcome the problems of the large volume is not satisfactory. It has been found that the surface tension of the materials generally used in the liquid phase epitaxy solutions causes the small volume of the solution to ball up into a spherical section so that the solution does not cover the entire surface of an average size substrate. Thus, the small volume solution would not uniformly deposit an epitaxial layer over the entire surface of the substrate.

A method and apparatus for achieving small volume of deposition solutions to achieve thin epitaxial layers is shown and described in U.S. Pat. No. 3,753,801 to H. F. Lockwood et al., issued Aug. 31, 1973, entitled "METHOD OF DEPOSITING EPITAXIAL SEMICONDUCTOR LAYERS FROM THE LIQUID PHASE." In this method and apparatus a weight is placed on the deposition solution in each well to spread out the solution across the entire area of the well and to hold the solution against the substrate when the substrate is in the well. Although this method and apparatus in general are satisfactory, there is a tendency for the solution in each well to be carried along with the coated substrate when the substrate is moved into the next well because of the force applied to the solution by the weight. Such a carrying over of the solution can cause a contamination of the solution in the next well, particularly since each solution is of small volume.

Figure 1:
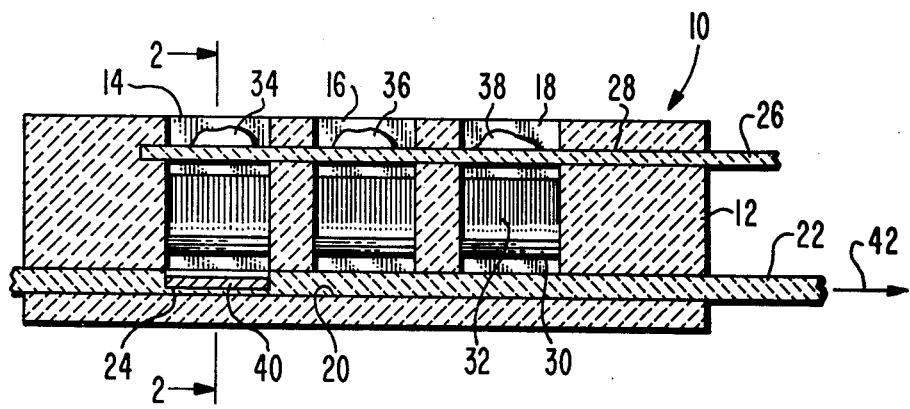
FIG. 1 is a cross-sectional view of a form of an apparatus of the present invention for carrying out the method of the present invention.

Referring to FIG. 1, a form of the apparatus of the present invention is generally designated as 10. The apparatus 10 comprises a refractory furnace boat 12 of an inert material, such as graphite, having three spaced wells 14, 16 and 18, in its upper surface. A passage 20 extends longitudinally through the boat 12 from one end to the other and extends across the bottoms of the wells 14, 16 and 18. A first slide 22 of a refractory material, such as graphite, movably extends through the passage 20 so that the top surface of the slide forms the bottom surface of the wells 14, 16 and 18. The slide 22 has a recess 24 in its upper surface adjacent one end of the slide. A second slide 26 of a refractory material, such as graphite, movably extends through a passage 28 which extends longitudinally through the boat 12 and crosses each of the wells 14, 16 and 18 adjacent to but spaced slightly from the open tops of the wells.

Figure 2:
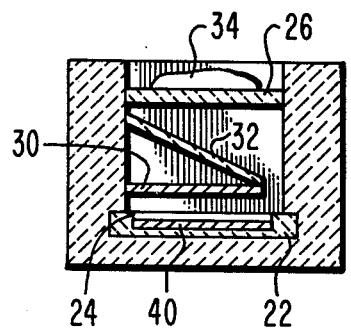
FIG. 2 is a sectional view taken along line 2—2 of FIG. 1.

A separate wafer 30 extends partially across each of the wells 14, 16 and 18 adjacent and spaced slightly from the top surface of the first slide 22. As shown in FIG. 2, each wafer 30 is spaced slightly from one wall of its well so as to provide an opening into the space between the wafer 30 and the first slide 22. A separate inclined guide plate 32 of a refractory material, such as graphite, extends partially across each well 14, 16 and 18. Each guide plate 32 is inclined downwardly from just below the second slide 26 to the edge of the wafer 30 which is spaced from the aforementioned one wall of the well.

To carry out the method of the present invention, a separate charge 34, 36 and 38 is placed in each of the wells 14, 16 and 18, respectively, on the second slide 26. Each of the charges 34, 36 and 38 is a mixture of a semiconductor material of the epitaxial layer to be deposited, a solvent for the semiconductor material and, if the epitaxial layer is to be a particular conductivity type, a conductivity modifier. For example, to deposit epitaxial layers of gallium arsenide the semiconductor material would be gallium arsenide, the solvent, which is generally metal, could be gallium and the conductivity modifier could be either tellurium or tin for an N type layer or zinc, germanium or magnesium for a P type layer. If the semiconductor material to be deposited is gallium aluminum arsenide, aluminum would be included with the gallium aresenide. The semiconductor material and the conductivity modifier are present in granulated solid form at room temperature. Since certain of the metal solvents which can be used, such as gallium, having a melting temperature close to room temperature, the melting temperature of gallium being about 30° C., the metal solvent may be present in either granulated solid form or in liquid form depending on the ambient temperature where the method is being carried out. The proportions of the ingredients of each of the charges 34, 36 and 38 is preferably such that when the semiconductor material is dissolved in the molten metal solvent, the resulting solution will be saturated with the semiconductor material.

Each of the wafers 30 is preferably of the same semiconductor material as contained in the particular charge 34, 36 or 38 in the respective well. Each wafer 30 is spaced from the first slide 22 a distance such that there is only a small volume of space therebetween. By small volume it is meant that there is only enough space to contain a thin layer of the deposition material. A substrate 40 of a material suitable for epitaxial deposition is placed in the recess 24 in the first slide. The recess 24 is large enough to allow the substrate 40 to lie flat therein.

The loaded furnace boat 12 is then placed in a furnace tube (not shown) and a flow of high purity hydrogen is provided through the furnace tube and over the furnace boat 12. The heating means for the furnace tube is turned on to heat the contents of the furnace boat 12 to a temperature above the melting temperature of the ingredients of the charges, for example, between 800° C. and 950° C. for gallium aluminum aresenide and gallium arsenide. The temperature is maintained long enough to insure complete melting and homogenization of the ingredients of the charges 34, 36 and 38.

The first slide 22 is then moved in the direction of the arrow 42 in FIG. 1 until the substrate 40 is within the first well 14. The second slide 26 is then moved in the same direction causing the molten charge 34, which is now a deposition solution, to drop onto the guide plate 32. The molten charge 34 will then roll down the guide plate 32 into the end of the space between the wafer 30 and the first slide 22. The molten charge 34 will then be sucked into the space between the wafer 30 and the first slide 22 by capillary action until the molten charge completely fills this space to provide a thin layer of deposition material. Since the wafer 30 is of the semiconductor material in the charge, which is also similar to or the same as the material of the substrate 40, the melting characteristics between the molten charge and each of the wafer 30 and the substrate 40 is substantially uniform so that the molten charge will flow easily into the space by capillary action. The substrate 40 is now in contact with a deposition solution which is exactly saturated with the semiconductor material and which is of small volume.

The heating means for the furnace tube is then either turned off or reduced in temperature to cool the furnace boat 12 and its contents. Cooling the exactly saturated deposition solution in the first well causes some of the semiconductor material in the deposition solution to precipitate and deposit on the surface of the substrate 40 to form a first epitaxial layer. During the deposition of the semiconductor material some of the conductivity modifiers in the deposition solution become incorporated in the lattice of the first epitaxial layer to provide the first epitaxial layer with a desired conductivity type. Since the deposition source is in the form of a thin layer, the cooling of the deposition source results only in the deposition of the precipitated semiconductor material on the surface of the substrate 40 with only a minimum of undesirable platlets being formed in the solution. Also, only a small amount of semiconductor material is deposited on the substrate 40 so that a thin epitaxial layer of the semiconductor material can be easily deposited on the substrate. At the same time that the semiconductor material is deposited on the substrate 40 some of the semiconductor material will also deposit on the wafer 30. However, this does not adversely affect the deposition on the substrate.

The first slide 22 is then again moved in the direction of the arrow 42 to bring the substrate 40 with the first epitaxial layer thereon into the second well 16. The second slide 26 is also moved in the direction of the arrow 42 to drop the molten charge 36 onto the guide plate 32 in the well 16. The molten charge 36 will roll into the end of the space between the wafer 30 and the first slide 22 and will be sucked into this spaced by capillary action. A second epitaxial layer will then be deposited on the substrate 40 in the manner as previously described. A third epitaxial layer of semiconductor material can be deposited on the substrate 40 by moving the substrate 40 into the well 18 and dropping the molten charge 38 from the second slide 26.

Thus there is provided a method and apparatus for depositing, by liquid phase epitaxy, a semiconductor layer from a thin layer of the deposition material. This method and apparatus has the advantage that there is no force being applied to the deposition material to press it against the substrate. Thus there is little tendency for the deposition material in each well to be pulled over with the substrate into the next well so that the chance of contaminating the deposition solution in the next well is reduced. Also, the space between each wafer and the first slide determines the volume of the deposition solution which contacts the substrate. Therefore the volume of the deposition solution which is brought into contact with the substrate, which determines the amount of semiconductor material which is deposited, can be accurately controlled even if the amount of material used in the charge is not accurately controlled. Also, since when the substrate is moved from one well to the next, it is moved into an empty well, the charge being dropped onto the substrate later, the temperature of the furnace boat can be adjusted at such times without affecting the substrate or the semiconductor layer thereon.

What is claimed is:

1. Apparatus for depositing on a substrate at least one epitaxial layer of a semiconductor material comprising
 a boat of a refractory material having at least one well therein,
 means for moving a substrate into and out of said well adjacent the bottom of the well,
 means extending partially across the well adjacent the bottom of the well and adapted to form a space of small volume between it and the substrate when the substrate is in the well to provide a capillary action between the substrate and the said extending means, and
 means for releasably supporting a deposition solution forming charge adjacent the open top of the well.

2. Apparatus in accordance with claim 1 in which the means for moving the substrate into and out of the well is a first slide which movably extends through the furnace boat and across the well at the bottom of the well.

3. Apparatus in accordance with claim 2 in which the means for releasably supporting the charge is a second slide movably extending through the furnace boat and across the well adjacent the top open end of the well.

4. Apparatus in accordance with claim 3 in which the means extending partially across the well is a wafer of the semiconductor material which is in closely spaced relation to the first slide and has an edge spaced from a wall of the well so as to provide a passage into the space between the source wafer and the first slide.

5. Apparatus in accordance with claim 4 including a guide plate extending partially across the well at an incline for just below the second slide to the edge of the wafer which is spaced from the wall of the well.

6. Apparatus in accordance with claim 5 in which the furnace boat has a plurality of spaced wells therein, each of the slides extends across all of the wells, a separate wafer extends partially across each well and a separate inclined guide plate extending partially across each well.

* * * * *